US012598795B2

(12) United States Patent
Hsiao et al.

(10) Patent No.: US 12,598,795 B2
(45) Date of Patent: Apr. 7, 2026

(54) SEMICONDUCTOR DEVICES AND METHOD OF FORMING THE SAME

(71) Applicant: Taiwan Semiconductor Manufacturing Company, Ltd., Hsinchu (TW)

(72) Inventors: Yu-Ting Hsiao, Taichung City (TW); Min-Hsiu Hung, Tainan City (TW); Wei-Jung Lin, Hsinchu City (TW); Chih-Wei Chang, Hsin-Chu (TW); Ming-Hsing Tsai, Hsinchu (TW)

(73) Assignee: Taiwan Semiconductor Mnaufacturing Company, Ltd., Hsinchu (TW)

( * ) Notice: Subject to any disclaimer, the term of this patent is extended or adjusted under 35 U.S.C. 154(b) by 821 days.

(21) Appl. No.: 17/832,689

(22) Filed: Jun. 6, 2022

(65) Prior Publication Data

US 2023/0395383 A1     Dec. 7, 2023

(51) Int. Cl.
H01L 21/285 (2006.01)
H10D 64/62 (2025.01)

(52) U.S. Cl.
CPC ....... H01L 21/28518 (2013.01); H10D 64/62 (2025.01)

(58) Field of Classification Search
CPC .......................... H01L 21/28518; H10D 64/62
See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 * | 9/2014 | Wang | H01L 21/76831 257/745 |
| 8,860,148 B2 | 10/2014 | Hu et al. | |
| 9,105,490 B2 * | 8/2015 | Wang | H01L 21/76856 |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 10,636,664 B2 * | 4/2020 | Wang | H01L 21/76829 |
| 2019/0067436 A1 * | 2/2019 | Wu | H10D 30/024 |
| 2022/0293602 A1 * | 9/2022 | Lai | H10D 30/6211 |

* cited by examiner

*Primary Examiner* — Nathan W Ha
(74) *Attorney, Agent, or Firm* — JCIPRNET

(57) ABSTRACT

A method of forming a semiconductor device includes the following steps. A first layer is provided, wherein a material of the first layer is amorphous or single crystal. A first conductive layer is directly deposited on the first layer, wherein the first conductive layer is in direct contact with the first layer, and a cross-sectional area of a grain of a material of the first conductive layer is larger than 500 nm$^2$.

20 Claims, 25 Drawing Sheets

106

112

110

108

104

102

100

SEMICONDUCTOR DEVICES AND METHOD OF FORMING THE SAME

BACKGROUND

The semiconductor integrated circuit (IC) industry has experienced exponential growth. Technological advances in IC design and materials have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased.

As the semiconductor device scaling down continues, challenges in fabrication may arise. For example, scaling down has also increased the risk of bridging or electrical shorting problems, which would degrade semiconductor device performance or even cause device failures. Although existing semiconductor fabrication methods have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
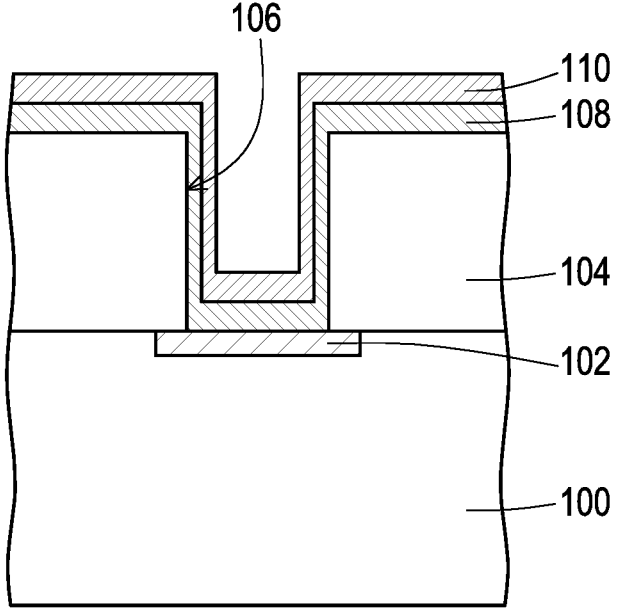
FIG. 1A to FIG. 1H are schematic cross-sectional views of a method of forming a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIG. 1A to FIG. 1H are schematic cross-sectional views of a method of forming a semiconductor device in accordance with some embodiments of the present disclosure.

Referring to FIG. 1A, a first material 108 is provided, and a second material 110 is formed on the first material 108. In some embodiments, a dielectric layer 104 having an opening 106 is formed on a conductive layer 102, and the first material 108 and the second material 110 are sequentially formed on sidewalls of the opening 106. The conductive layer 102 may include metal such as W, Cu, Co, Ti, Ta, Al, Zr and Hf, alloy such as TiAl, metal compound such as WN, TiAlN, TaCN and TiN, semiconductor such as SiGe, SiC, SiP and SiCP, combinations thereof or any suitable conductive material. The conductive layer 102 may by formed by a CVD, PVD, plating, or a suitable process. In some embodiments, the conductive layer 102 is disposed in a dielectric layer 100. The dielectric layer 100 may include silicon oxide, silicon nitride, silicon oxynitride, silicon carbide, phosphosilicate glass (PSG), borosilicate glass (BSG), boron-doped phosphosilicate glass (BPSG), fluoride-doped silicate glass (FSG), a spin-on dielectric material, a low-k dielectric material, any suitable dielectric material or a combination thereof. The dielectric layer 100 may be formed by a suitable deposition technique such as PVD, CVD, ALD, and a combination thereof or the like. However, the disclosure is not limited thereto. In some alternative embodiments, the conductive layer 102 is disposed in a substrate such as a semiconductor substrate.

In some embodiments, the dielectric layer 104 includes silicon oxide, silicon nitride, silicon oxynitride, silicon carbide, phosphosilicate glass (PSG), borosilicate glass (BSG), boron-doped phosphosilicate glass (BPSG), fluoride-doped silicate glass (FSG), a spin-on dielectric material, a low-k dielectric material, any suitable dielectric material or a combination thereof. The dielectric layer 104 may be formed by a suitable deposition technique such as spin-coating, CVD, PVD, ALD and a combination thereof or the like. In some embodiments, the dielectric layer 104 has the opening 106 to expose the conductive layer 102. The opening 106 may be formed by a photolithography process.

In some embodiments, the first material 108 is formed on exposed surfaces of the opening 106, to be in direct contact with the conductive layer 102. In some embodiments, the first material 108 is formed on sidewalls and a bottom surface of the opening 106 and extends on a top surface of the dielectric layer 104. In some embodiments, the first material 108 is conformally formed with the opening 106 of the dielectric layer 104. The first material 108 includes amorphous material or single crystal material, for example. The amorphous material includes semiconductor oxide such as silicon oxide, silicide such as titanium silicide (TiSi) or the like, and the single crystal material includes semiconductor such as silicon and germanium, metal such as W, Cu, Co, Ti, Ta, Al, Zr and Hf or the like. The first material 108 may be formed by a suitable deposition technique such as spin-coating, CVD, PVD and ALD, a combination thereof or the like. In an embodiment in which the first material 108 is silicide, the first material 108 is formed by depositing a metal layer on the conductive layer 102 having a semiconductor, and then performing a thermal process to form silicide. The metal layer may include W, Cu, Co, Ti, Ta, Al, Zr, Hf or the like and may be formed by a suitable deposition technique such as spin-coating, CVD, PVD, ALD, a combination thereof or the like. In some embodiments, a thickness of the first material 108 on horizontal surfaces such as the top surface of the dielectric layer 104 and the bottom surface of the opening 106 is larger than a thickness of the first material 108 on vertical surfaces such as the sidewalls of the opening 106. In addition, the thickness of the first material 108 on the conductive layer 102 is larger than the thickness of the first material 108 on other portions. However, the disclosure is not limited thereto. In alternative embodiments, the thickness of the first material 108 on the conductive layer 102 is substantially the same as the thickness of the first material 108 on other portions.

After forming first material 108, the second material 110 is directly formed on the first material 108. In some embodiments, the first material 108 is also referred to as a grain-boundary free substrate. The second material 110 is in direct contact with the first material 108. In some embodiments, the second material 110 is conformally formed on the first material 108. The second material 110 includes metal such as W, Cu, Co, Ti, Ta, Al, Zr and Hf, alloy such as TiAl, metal compound such as WN, TiAlN, TaCN and TiN, combinations thereof or any suitable conductive material. The second material 110 may be formed by a suitable deposition technique such as PVD, CVD, ALD and a combination thereof or the like. For example, the second material 110 is formed by PVD. In some embodiments, a thickness of the second material 110 on horizontal surfaces such as the top surface of the dielectric layer 104 and the bottom surface of the opening 106 is larger than a thickness of the second material 110 on vertical surfaces such as the sidewalls of the opening 106.

Figure 2:
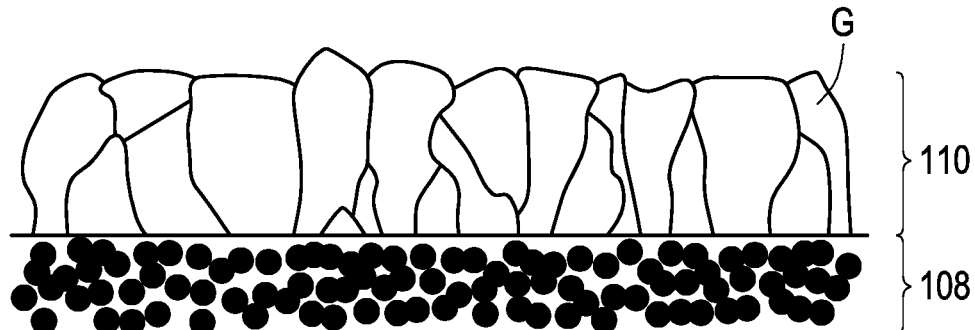
FIG. 2 is a schematic view of grains of a first material and a second material according to some embodiments of the disclosure.

In some embodiments, as shown in FIG. 2, since the second material 110 is directly deposited on the first material 108 which is amorphous or single crystal (e.g., a grain-boundary free substrate), grains G of the second material 110 have larger size and less boundary. For example, a cross-sectional area of the grain G of the second material 110 is larger than 500 $nm^2$, 600 $nm^2$, 700 $nm^2$, 800 $nm^2$, 900 $nm^2$, 1000 $nm^2$, 2000 $nm^2$, 3000 $nm^2$, 4000 $nm^2$, 5000 $nm^2$, 6000 $nm^2$, 7000 $nm^2$, 8000 $nm^2$, 9000 $nm^2$, 10000 $nm^2$, 11000

$nm^2$, 12000 $nm^2$, 13000 $nm^2$, 14000 $nm^2$, 15000 $nm^2$, 16000 $nm^2$, 17000 $nm^2$ or 18000 $nm^2$. In some embodiments, the second material 110 has less grain-boundary or is substantially free of grain-boundary, and thus the resistance of the second material 110 is low. In addition, the second material 110 may be formed by in-situ deposition process, that is, the chamber for the deposition process of the second material 110 may be the same as the chamber for the formation of the first material 108. Due to the in-situ deposition, there may be interface oxidation free between the second material 110 and the first material 108, and thus the second material 110 may provide low contact resistance. In some embodiments, the second material 110 is deposited in the opening 106 (e.g., a via) having a substantially the same width. However, the disclosure is not limited thereto. In some alternative embodiments, the second material 110 is simultaneously deposited in a via and a trench connecting to the via. In addition, in some embodiments, the first material 108 and the second material 110 are illustrated as being deposited in the opening 106. However, the disclosure is not limited thereto. In some alternative embodiments, at least one of the first material 108 and the second material 110 is formed on a plane. In some embodiments, the first material 108 is formed on the conductive layer 102. However, the disclosure is not limited thereto. In some alternative embodiments, the first material 108 is a portion of the dielectric structure such as STI, and the second material 110 is deposited directly on the first material 108.

Figure 1B:
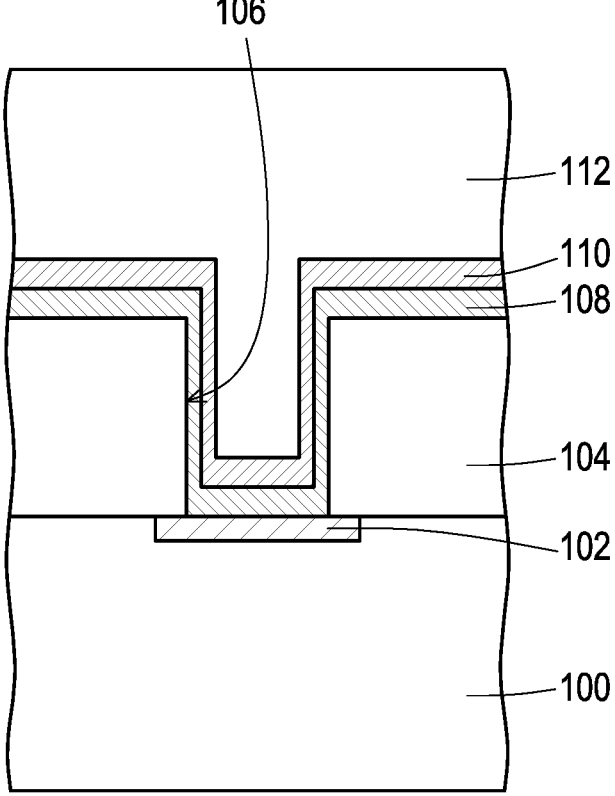

Referring to FIG. 1B, a protection layer 112 is formed on the second material 110 to fill the opening 106. In some embodiments, the protection layer 112 is blanket formed, to cover a top surface of the second material 110 and fills up the opening 106. For example, the protection layer 112 further extends onto the top surface of the dielectric layer 104. In some embodiments, the protection layer 112 includes an organic or inorganic material, and the protection layer 112 is formed by a suitable deposition technique such as spin-coating, CVD, PVD, ALD and a combination thereof or the like. In an embodiment, the protection layer 112 includes a bottom anti-reflective coating layer.

Figure 1C:
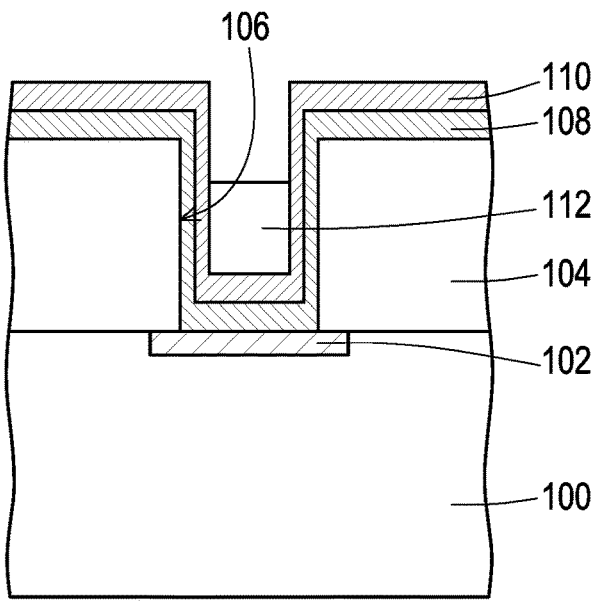

Referring to FIG. 1C, the protection layer 112 is partially removed. For example, a portion of the protection layer 112 outside the opening 106 and a portion of the protection layer 112 in the opening 106 are removed. After partial removal, a top surface of the protection layer 112 may be lower than the top surface of the dielectric layer 104. For example, portions of the first material 108 and the second material 110 on the sidewalls of the opening 106 are exposed. In some embodiments, the protection layer 112 is removed by an etching process such as a dry etching process and a wet etching process.

Figure 1D:
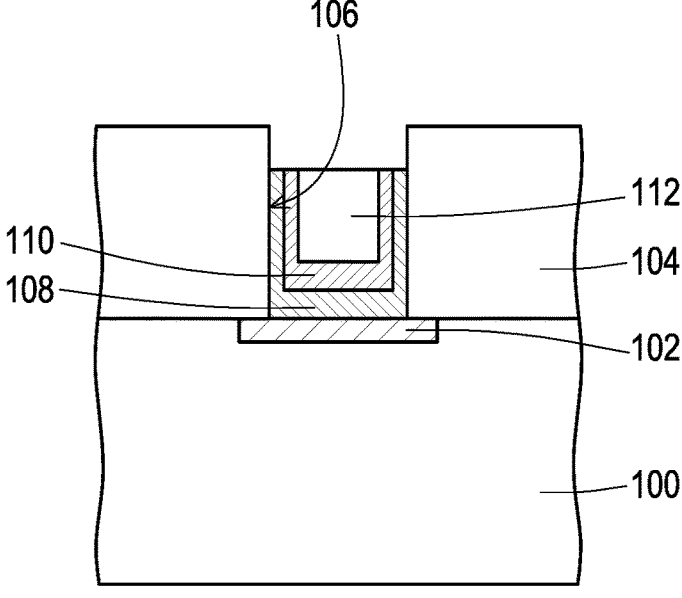

Referring to FIG. 1D, a pull-back process is performed on the first material 108 and the second material 110. The "pull-back" process may be equivalently referred to as an "etch-back" process. In some embodiments, top portions of the first material 108 and the second material 110 are removed by the pull-back process. For example, the portions of the first material 108 and the second material 110 are removed, resulting in the first material 108 and the second material 110 have top surfaces substantially flush with the top surface of the protection layer 112. In some embodiments, the pull-back process includes a dry etching process, a wet etching process or combinations thereof.

Figure 1E:
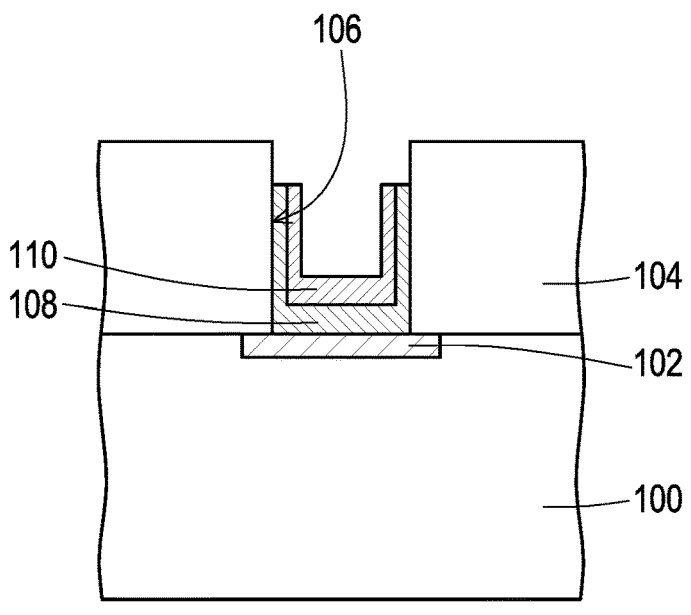

Referring to FIG. 1E, the protection layer 112 is removed. In some embodiments, the protection layer 112 is removed by an ashing process, an etching process or combinations thereof.

Figure 1F:
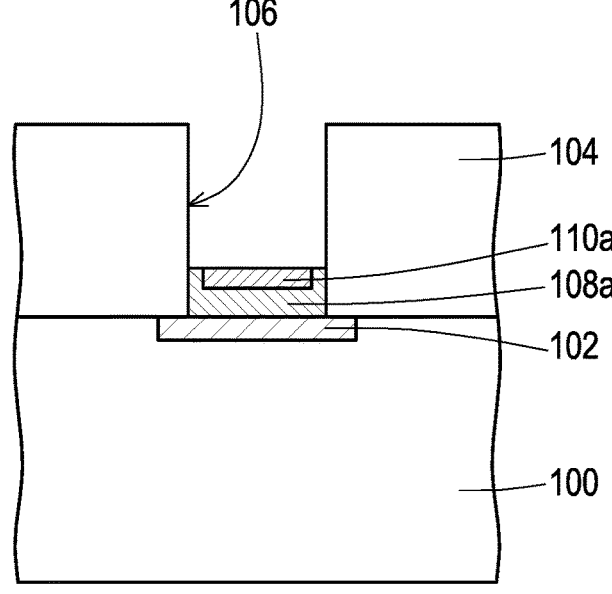

Referring to FIG. 1F, a pull-back process is performed on the first material 108 and the second material 110, to form a first material layer 108a and a second material layer 110a. In some embodiments, the first material 108 and the second material 110 on the sidewalls of the opening 106 are removed by the pull-back process. In addition, a top portion of the second material 110 on the bottom of the opening 106 may be partially removed by the pull-back process. In other words, a thickness of the second material layer 110a of FIG. 1F at the bottom of the opening 106 is smaller than a thickness of the second material 110 of FIG. 1E. In some embodiments, the pull-back process includes a dry etching process, a wet etching process or combinations thereof. After the pull-back process, top surfaces of the first material layer 108a and the second material layer 110a are substantially coplanar, for example. In some embodiments, the first material layer 108a surrounds the second material layer 110a, and the top surface of the first material layer 108a is exposed.

Figure 1G:
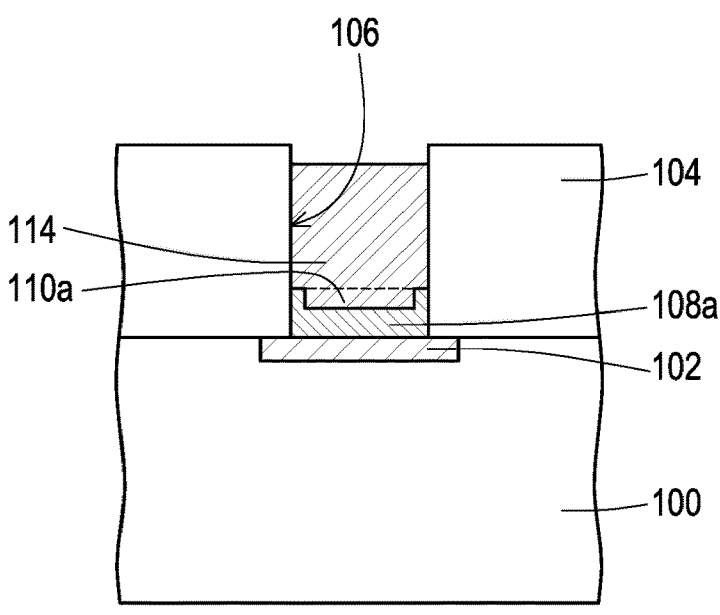

Referring to FIG. 1G, a second material 114 is directly formed on the second material layer 110a to fill the opening 106. In some embodiments, the second material layer 110a is also referred to as a grain-boundary free substrate. The second material 114 is in direct contact with the second material layer 110a. In some embodiments, the second material 114 has the same material as the second material layer 110a. For example, the second material layer 110a and the second material 114 both include tungsten. The second material 114 may be formed by a suitable deposition technique such as PVD, CVD, ALD, a combination thereof or the like. For example, the second material 114 is formed by a selective metal deposition process. In some embodiments, as shown in FIG. 1G, the second material 114 fills the opening 106 and is further extended outside the opening 106. For example, the second material 114 covers the top surface of the dielectric layer 104. In some embodiments, since the second material 114 is directly formed on the second material layer 110a (e.g., a grain-boundary free substrate), grains of the second material 114 have size similar to or substantially the same as the grains G shown in FIG. 2. In other words, a cross-sectional area of the grain of the second material 114 is larger than 500 nm², 600 nm², 700 nm², 800 nm², 900 nm², 1000 nm², 2000 nm², 3000 nm², 4000 nm², 5000 nm², 6000 nm², 7000 nm², 8000 nm², 9000 nm², 10000 nm², 11000 nm², 12000 nm², 13000 nm², 14000 nm², 15000 nm², 16000 nm², 17000 nm² or 18000 nm². In some embodiments, the second material 114 has less grain-boundary or is substantially free of grain-boundary.

Figure 1H:
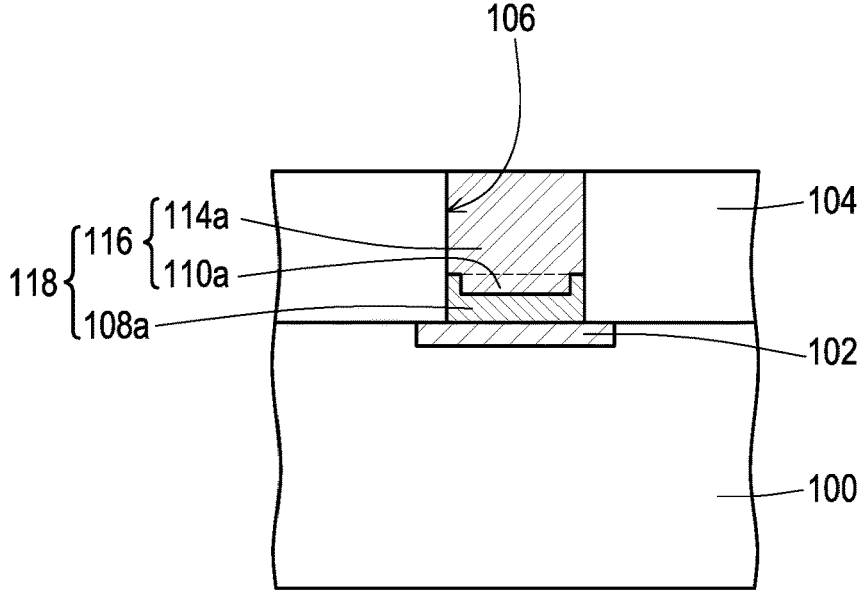

Referring to FIG. 1H, a portion of the second material 114 outside the opening 106 is removed, so as to form a second material layer 114a in the opening 106. In some embodiments, the second material 114 outside the opening 106 is entirely removed by a planarization process such as a CMP process. For example, the second material 114 outside the opening 106 and a portion of the dielectric layer 104 are removed by the planarization process, such that a top surface of the second material layer 114a is substantially coplanar with a top surface of the dielectric layer 104. In some embodiments, the second material layer 110a and the second material layer 114a are collectively referred to as a second material layer 116, and the second material layer 116 and the first material layer 108a therebeneath are collectively referred to as a conductive structure 118. The conductive structure 118 may be a plug, a via, a conductive connector, a conductive line, a conductive layer or the like.

In some embodiments, since the second material layer 116 has larger grain size and less grain-boundary (or the second material layer 116 is substantially free of grain-boundary), the resistance of the second material layer 116 is low. Accordingly, the conductive structure 118 including the second material layer 116 provides low resistance and low contact resistance.

Figure 3A:
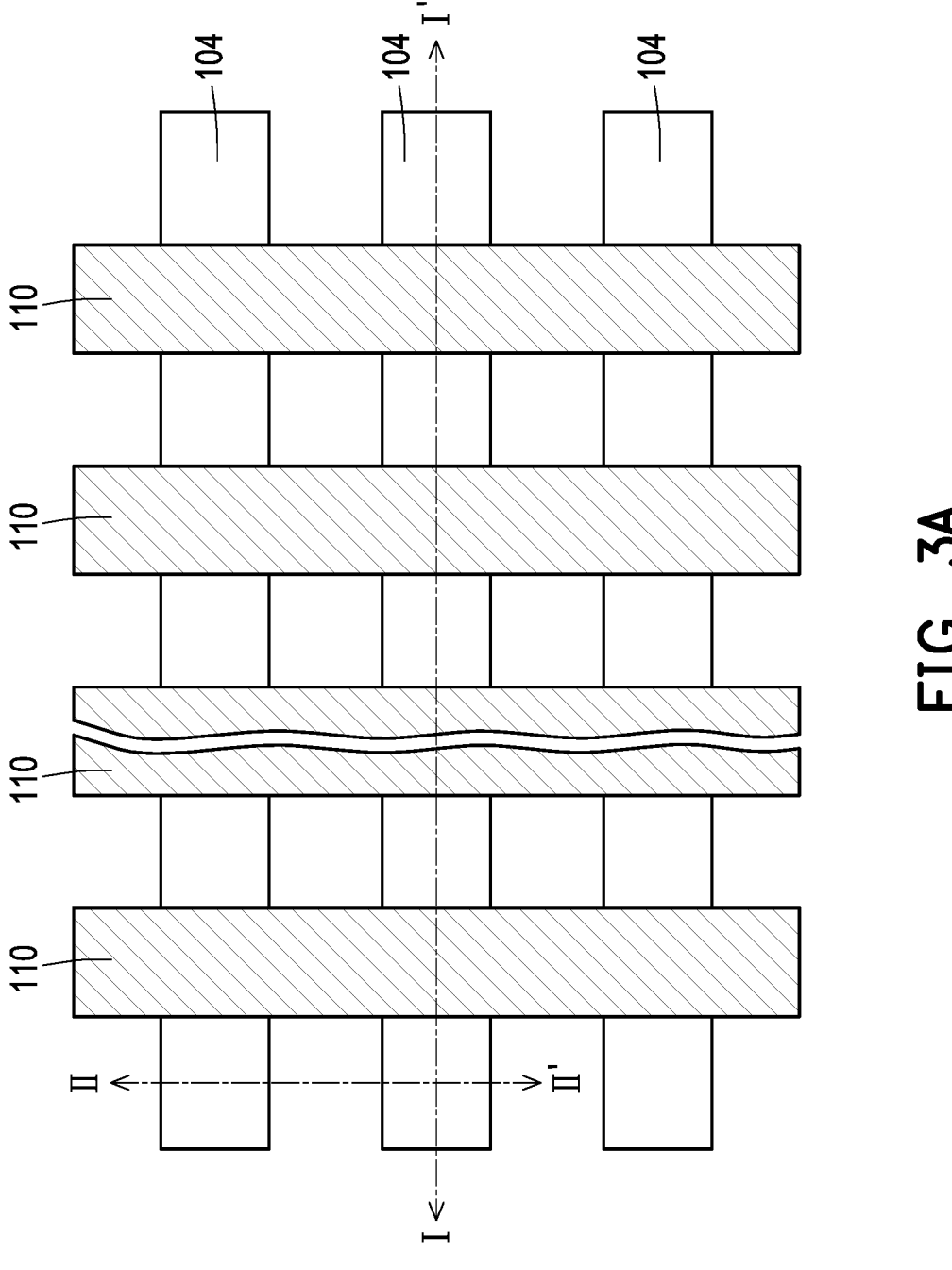
FIG. 3A is a simplified top view of a semiconductor device in accordance with some embodiments of the present disclosure.
Figure 3B:
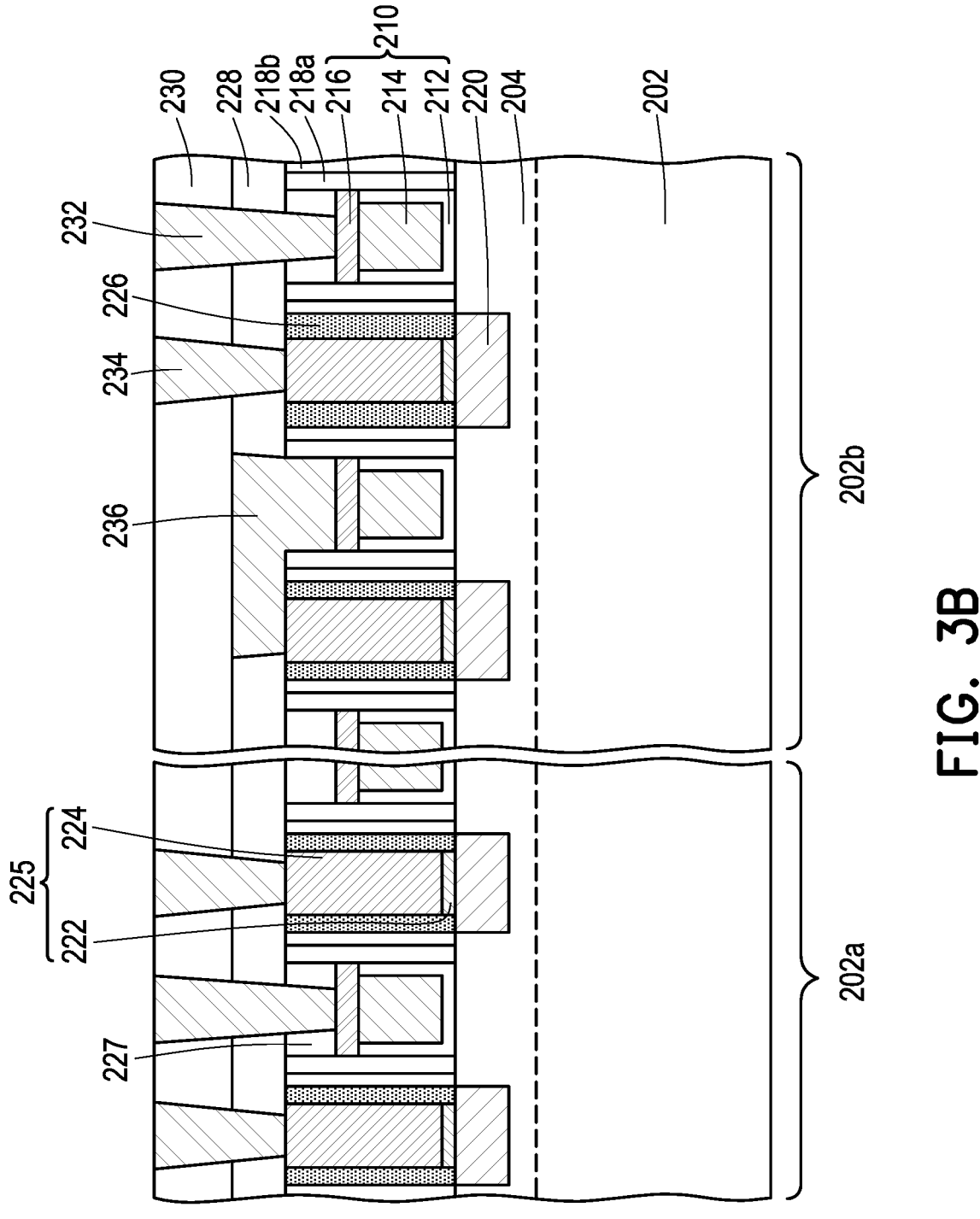
FIG. 3B is a cross-sectional view taken along cross section line I-I' in FIG. 3A.

FIG. 3A is a simplified top view of a semiconductor device in accordance with some embodiments of the present disclosure. FIG. 3B is a cross-sectional view taken along cross section line I-I' in FIG. 3A. Referring to FIG. 3A and FIG. 3B, a semiconductor device 200 is provided. In some embodiments, the semiconductor device 200 is a field effect transistor such as a fin field effect transistor (FinFET). The FinFET refers to any fin-based, multi-gate transistor. In alternative some embodiments, the field effect transistor is a planar metal-oxide-semiconductor field effect transistor (MOSFET). Other transistor structures and analogous structures, such as gate-all-around (GAA) field effect transistor or tunneling field effect transistor (TFET), are within the contemplated scope of the disclosure. The field effect transistor may be included in a microprocessor, memory cell, and/or other integrated circuit (IC). In some embodiments, FIG. 3A and FIG. 3B are simplified for a better understanding of the concepts of the present disclosure. For example, although the figures illustrate the interconnect structure of a field effect transistor, it is understood the field effect transistor may be part of an IC that further includes a number of other devices such as resistors, capacitors, inductors, fuses, etc.

In some embodiments, the semiconductor device 200 includes a substrate 202, a plurality of gate structures 210 over the substrate 202, a plurality of strained layers 220 aside the gate structures 210 in the substrate 202, a plurality of conductive structures 225 on the strained layers 220, a plurality of gate contacts 232 on the gate structures 210 and a plurality of source and drain contacts 234 on the second material layer 224.

The substrate 202 includes silicon in some embodiments. Alternatively or additionally, the substrate 202 may include other elementary semiconductor such as germanium. The substrate 202 may also include a compound semiconductor such as silicon carbide, gallium arsenic, indium arsenide, and indium phosphide. The substrate 202 may also include an alloy semiconductor such as silicon germanium, silicon germanium carbide, gallium arsenic phosphide, and gallium indium phosphide. In one embodiment, the substrate 202 includes an epitaxial layer. For example, the substrate 202 has an epitaxial layer overlying a bulk semiconductor. Furthermore, the substrate 202 may include a semiconductor-on-insulator (SOI) structure. For example, the substrate 202 includes a buried oxide (BOX) layer formed by a process such as separation by implanted oxygen (SIMOX) or other suitable technique, such as wafer bonding and grinding. Depending on the requirements of design, the substrate 202 may be a P-type substrate or an N-type substrate and may have doped regions therein. The doped regions may be configured for a P-type FinFET device or an N-type FinFET device. In some embodiments, the substrate 20 include a logic region 202a and a memory region 202b. For example, the memory region 202b is configured for SRAM.

In some embodiments, a plurality of fins 204 are formed on and/or in the substrate 202. In some embodiments, portions of the substrate 202 are removed to define the fins 204 protruding from the substrate 202. In some embodiments, the substrate 202 and the fins 204 are integrally formed, that is, there is no boundary between the substrate 202 and the fins 204. However, other techniques for fabricating the fins 204 are possible. In some embodiments, the substrate 202 and the fins 204 are made of a same material. In some embodiments, the fins 204 are respectively extended along a first direction such as the x direction, and the fins 204 are arranged in a second direction perpendicular to the first direction such as the y direction, for example. In some alternative embodiments, a dummy fin is further formed between the fins 204, and the dummy fin is substantially parallel to the fins 204.

In some embodiments, an isolation structure (not shown) is formed between the fins 204, such as a local oxidation of silicon (LOCOS) or a shallow trench isolation (STI) structure. The isolation structure is configured to isolate the adjacent fins 204. For example, the isolation layer covers lower portions of the fins 204 and exposes upper portions of the fins 204. The isolation structure may be formed by filling a trench between the fins 204 with a dielectric material. In some embodiments, the dielectric material includes silicon oxide, silicon nitride, silicon oxynitride, fluoride-doped silicate glass (FSG), a spin-on dielectric material, a low-k dielectric material, any suitable dielectric material or a combination thereof. The dielectric material may be formed by high-density-plasma chemical vapor deposition (HDP-CVD), sub-atmospheric CVD (SACVD) or by spin-on. In some embodiments, the isolation structure has a multi-layer structure such as a thermal oxide liner layer filled with silicon nitride or silicon oxide.

The gate structures 210 may be each disposed on and cross over portions of the fins 204. The gate structures 210 each include a gate dielectric layer 212 and a gate electrode 214, for example. In some embodiments, a material of the gate dielectric layer 212 includes silicon oxide, silicon nitrides, silicon oxynitride or any suitable dielectric material. In some embodiments, the gate dielectric layer 212 includes a high-k dielectric material having a dielectric constant that is greater than a dielectric constant of $SiO_2$, which is approximately 4. In some embodiments, the high-k gate dielectric material includes $HfO_2$, $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, SrTiO or any suitable high-k dielectric material. The gate electrode 214 is disposed over the gate dielectric layer 212. In some embodiments, a material of the gate electrode 214 includes a metal such as TiAl, TiAlN, TaCN, TiN, WN, W, combinations thereof or any suitable conductive material. In some embodiments, the gate structures 210 further each include a cap layer 216 thereon. For example, the cap layer 216 is disposed on top surfaces of the gate dielectric layer 212 and the gate electrode 214. In some embodiments, a material of the cap layer 216 includes aluminum (Al), tungsten (W), copper (Cu), combinations thereof or any suitable conductive material.

In some embodiments, a pair of gate spacers 218a, 218b is respectively formed on the sidewalls of the gate structures 210. In some embodiments, top surfaces of the gate spacers 218a, 218b are higher than top surfaces of the gate structures 210. In some embodiments, the top surfaces of the gate spacers 218a, 218b are higher than top surfaces of the cap layers 216. However, the disclosure is not limited thereto. In some embodiments, the gate spacers 218a, 218b have single-layer structure or multi-layer structure. In some embodiments, a material of the gate spacers 218a, 218b includes $SiO_2$, SiN, SiON, SiCN or any suitable material.

In some embodiments, the strained layers 220 are disposed in the substrate 202 aside the gate structures 210 respectively. In some embodiments, two strained layers 220 are formed beside each of the gate structures 210, and one of the strained layers 220 is between the gate structures 210. In some embodiments, the strained layers 220 include silicon germanium (SiGe) for a P-type FinFET device. In alternative embodiments, the strained layers 220 include silicon carbon (SiC), silicon phosphate (SiP), SiCP or a SiC/SiP multi-layer structure for an N-type FinFET device. In some embodiments, the strained layers 220 may be optionally implanted with a P-type dopant or an N-type dopant as needed. In some embodiments, the method of forming the strained layers 220 includes forming recesses in the fins 202, and growing epitaxy layers from the recesses. In some embodiments, the strained layers 220 are referred to as source/drain regions. In some embodiments, the strained layers 220 may be shaped as any suitable shapes. For example, as shown in FIG. 3A and FIG. 3B, each strained layer 220 is shaped as a diamond.

In some embodiments, the second material layer 224 is disposed on the strain layer 220 and is electrically connected to the strain layer 220. Top surfaces of the second material layer 224 may be substantially coplanar with the top surfaces of the gate spacers 218a, 218b. In some embodiments, an etch stop layer 226 is disposed aside the second material layer 224. In some embodiments, the etch stop layer 226 includes SiN, SiC or the like. In some embodiments, the etch stop layer 226 is referred to as a contact etch stop layer (CESL). In some embodiments, a top surface of the etch stop layer 226 is substantially coplanar with the top surfaces of the conductive structure 225 and the gate spacers 218a, 218b.

In some embodiments, a dielectric layer 227 is located over the cap layers 216 of the gate structures 210. For example, the dielectric layer 227 covers the cap layers 216. In some embodiments, the dielectric layer 227 include a dielectric material such as high-k dielectric having a dielectric constant greater than a dielectric constant of $SiO_2$, which is approximately 4. The high-k dielectric material may have a dielectric constant greater than about 5, greater than about 8 or even greater than about 10. The high-k dielectric material includes SiON, metal oxides such as oxides of Ta, Ti, Li, Be, Mg, Ca, Sr, Sc, Y, Zr, Hf, Al, La, Ce, Pr, Nd, Sm, Eu, Gd, Tb, Dy, Ho, Er, Tm, Yb and Lu and any suitable materials.

In some embodiments, the dielectric layer 228 is disposed over the substrate 202 to cover the dielectric layer 227 on the gate structures 210 and the gate spacers 218a, 218b. The top surfaces of the gate spacers 218a, 218b may be in direct contact with the dielectric layer 228. In some embodiments, opposite sidewalls of the dielectric layer 228 are extended beyond outer sidewalls of the gate spacers 218a, 218b. For example, the sidewalls of the dielectric layer 228 are respectively overlapped and aligned with outer sidewalls of an etch stop layer 226. In some embodiments, the dielectric layer 228 includes SiN, SiC or the like. The dielectric layer 228 is formed by a suitable deposition technique such as spin-coating, CVD, PVD, ALD, a combination thereof or the like. In some embodiments, the dielectric layer 228 is referred to as a contact etch stop layer. In some alternative embodiments, the dielectric layer 227 and the dielectric layer 228 may be integrally formed as a single layer such as a CESL.

A dielectric layer 230 is disposed on the dielectric layer 228. In some embodiments, the dielectric layer 230 includes oxide such as silicon oxide, phosphosilicate glass (PSG), borosilicate glass (BSG), boron-doped phosphosilicate glass (BPSG), a combination thereof or the like. The dielectric layer 230 is formed by a suitable deposition technique such as spin-coating, CVD, PVD, ALD, a combination thereof or the like. The dielectric layer 230 may be a single-layer or multi-layer structure.

In some embodiments, the gate contacts 232 are respectively disposed in the dielectric layers 227, 228 and 230 to electrically connect to the gate structures 210. In some embodiments, the gate contacts 232 include metal, such as tungsten, copper, an alloy thereof or any metal material. In some embodiments, the top surfaces of the gate contacts 232 are substantially coplanar with the top surface of the dielectric layer 230.

In some embodiments, the source and drain contacts 234 are respectively disposed in the dielectric layer 228 and the dielectric layer 230 to electrically connect to the second material layer 224. In some embodiments, the source and drain contacts 234 include metal, such as tungsten, copper, an alloy thereof or any metal material. In some embodiments, the top surfaces of the source and drain contacts 234 are substantially coplanar with the top surface of the dielectric layer 230. The source and drain contacts 234 may be formed before, simultaneously or after the formation of the gate contacts 232.

In some embodiments, as shown in FIG. 3B, from a cross-sectional view, a contact 236 is further disposed on the gate structure 210 and extended onto the conductive structure 225 immediately adjacent to the gate structure 210. In some embodiments, the contact 236 includes metal, such as tungsten, copper, an alloy thereof or any metal material. In some embodiments, a top surface of the contact 236 is covered by the dielectric layer 230, and is substantially flush with top surfaces of the dielectric layer 228 and the gate spacers 218a, 218b. In such embodiments, the contact 236 is formed before, the formation of the gate contacts 232 and the source and drain contacts 234. However, the disclosure is not limited thereto. In alternative embodiments, the top surface of the contact 236 is substantially flush with the top surface of the top surface of the dielectric layer 230. In such embodiments, the contact 236 is formed before, simultaneously or after the formation of the gate contacts 232 and the source and drain contacts 234.

In some embodiments, the conductive structure 225 include a first material layer 222 and a second material layer 224 on the first material layer 222 and the conductive structure 225 is formed by the process of FIG. 4A to FIG. 4H and FIG. 5A to FIG. 5H.

FIG. 4A to FIG. 4H and FIG. 5A to FIG. 5H are schematic cross-sectional views of a method of forming a semiconductor device in accordance with some embodiments of the present disclosure. FIG. 4A to FIG. 4H are schematic cross-sectional views taken along cross section line I-I' in FIG. 3A, and FIG. 5A to FIG. 5H are schematic cross-sectional views taken along cross section line II-II' in FIG. 3A.

Figure 4A:
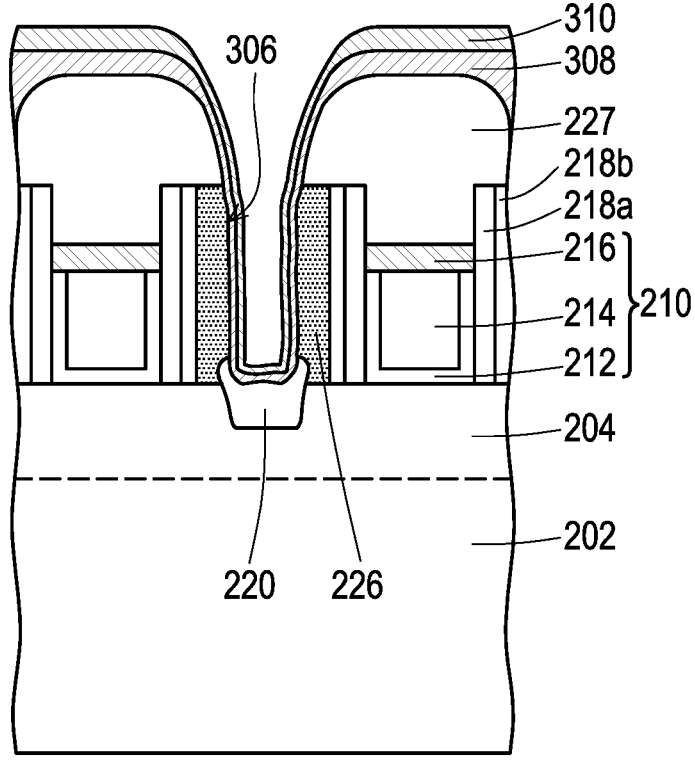
FIG. 4A to FIG. 4H and FIG. 5A to FIG. 5H are schematic cross-sectional views of a method of forming a semiconductor device in accordance with some embodiments of the present disclosure.
Figure 5A:
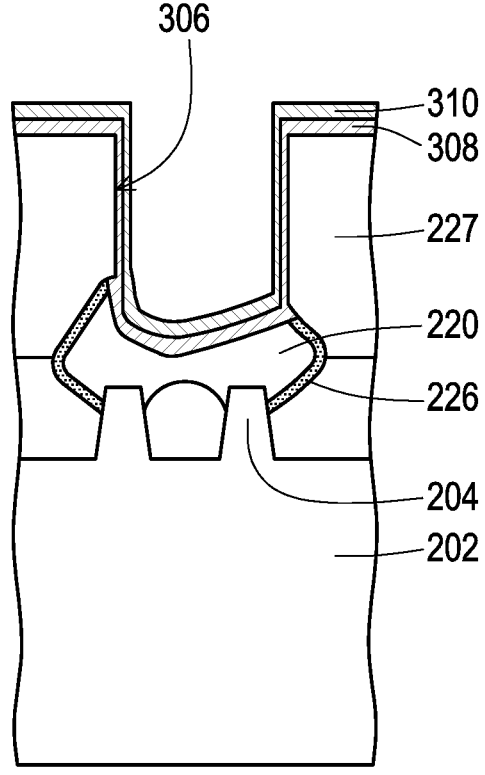

Referring to FIG. 4A and FIG. 5A, a first material 308 is formed on the strain layer 220, and a second material 310 is formed on the first material 308. In some embodiments, the first material 308 is formed on exposed surfaces of an opening 306 of a dielectric layer 227, to be in direct contact with the strain layer 220. In some embodiments, the material and the forming method of the dielectric layer 227 are the same as or similar to the dielectric layer 104, and thus details are not repeated. In some embodiments, a material of the first material 308 includes silicide such as titanium silicide (TiSi). In some embodiments, the first material 308 is formed by depositing a metal layer such as Ti on the strain layer 220 and the dielectric layer 227 both having a semiconductor, and then performing a thermal process to form silicide. The metal layer may be formed by a suitable deposition technique such as spin-coating, CVD, PVD, ALD, a combination thereof or the like. In some embodiments, the strain layer 220 has a concave top surface. However, the disclosure is not limited thereto. In some alternative embodiments, the strain layer 220 has a flat top surface.

After forming the first material 308, the second material 310 is directly formed on the first material 308. In some embodiments, the first material 308 is also referred to as a grain-boundary free substrate. The second material 310 is in direct contact with the first material 308. In some embodiments, the second material 310 is conformally formed on the first material 308. The second material 310 includes metal such as W, Cu, Co, Ti, Ta, Al, Zr and Hf, alloy such as TiAl, metal compound such as WN, TiAlN, TaCN and TiN, combinations thereof or any suitable conductive material. The second material 110 may be formed by a suitable deposition technique such as PVD, CVD, ALD and a combination thereof or the like. For example, the second material 310 is formed by PVD. In an embodiment, the first material 308 includes TiSi, and the second material 310 includes W. In some embodiments, since the second material 310 is directly deposited on the first material 308 which is amorphous or single crystal (e.g., a grain-boundary free substrate), grains of the second material 310 have larger size and less boundary similar to the grains G shown in FIG. 2. For example, a cross-sectional area of the grain of the second material 310 is larger than 500 nm$^2$, 600 nm$^2$, 700 nm$^2$, 800 nm$^2$, 900 nm$^2$, 1000 nm$^2$, 2000 nm$^2$, 3000 nm$^2$, 4000 nm$^2$, 5000 nm$^2$, 6000 nm$^2$, 7000 nm$^2$, 8000 nm$^2$, 9000 nm$^2$, 10000 nm$^2$, 11000 nm$^2$, 12000 nm$^2$, 13000 nm$^2$, 14000 nm$^2$, 15000 nm$^2$, 16000 nm$^2$, 17000 nm$^2$ or 18000 nm$^2$.

Figure 4B:
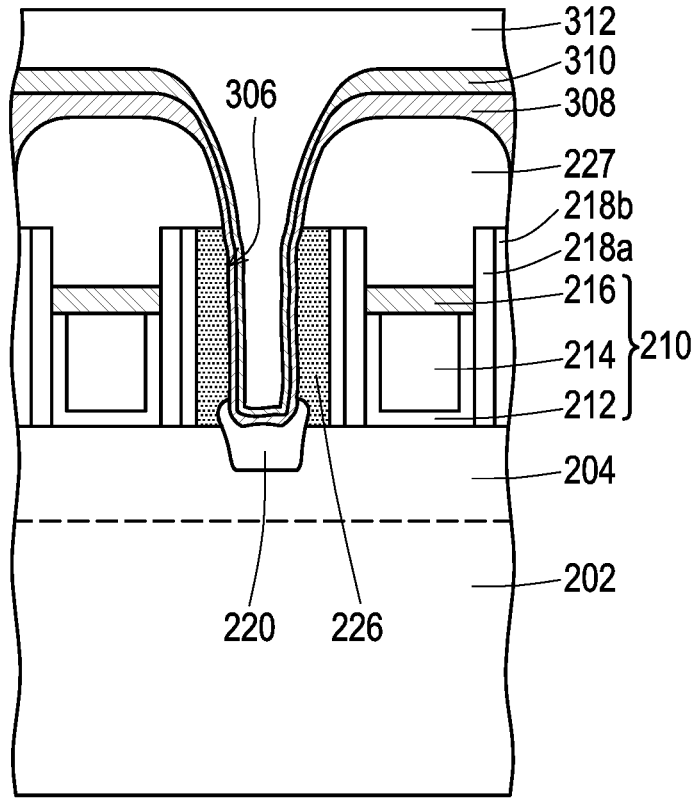
Figure 5B:
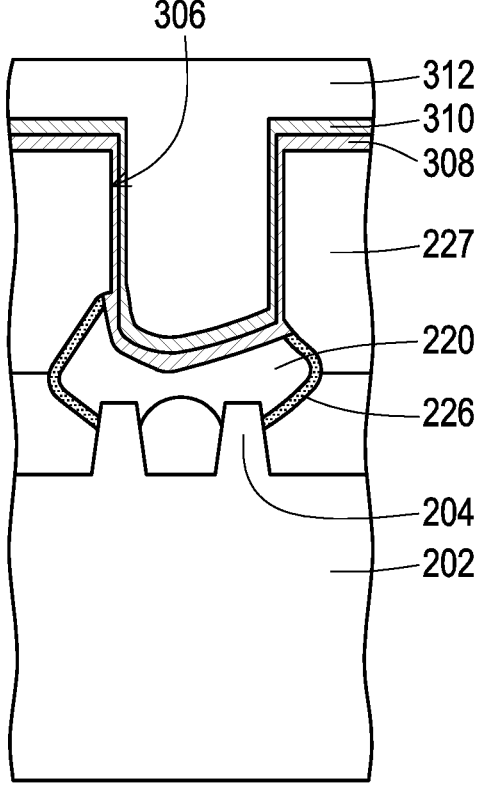

Referring to FIG. 4B and FIG. 5B, a protection layer 312 may be formed on the second material 310 to fill the opening 306. In some embodiments, the protection layer 312 is blanket formed, to cover a top surface of the second material 310 and fills up the opening 306. For example, the protection layer 112 further extends onto a top surface of the dielectric layer 227. In some embodiments, the protection layer 312 includes an organic or inorganic material, and the protection layer 312 is formed by a coating process. In an embodiment, the protection layer 312 includes a bottom anti-reflective coating layer.

Figure 4C:
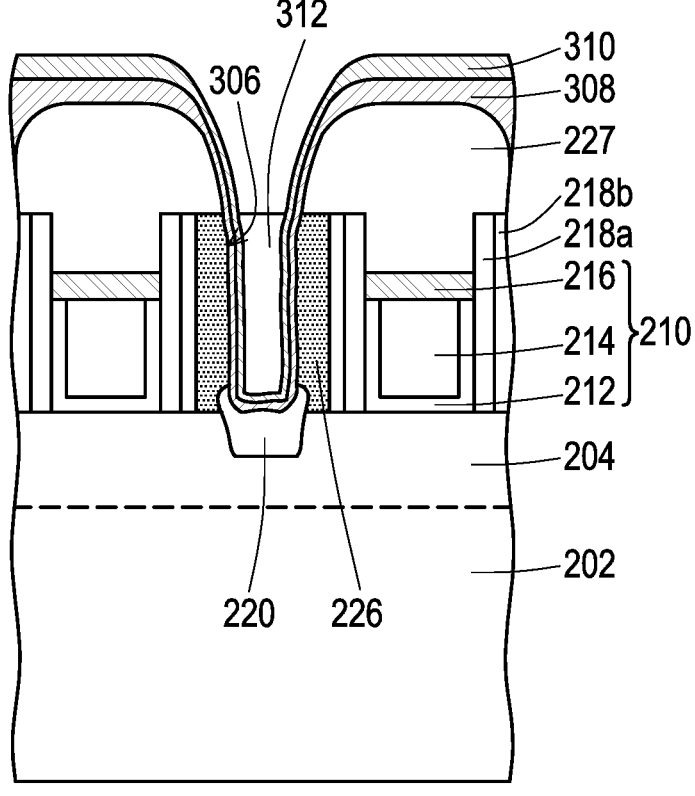
Figure 5C:
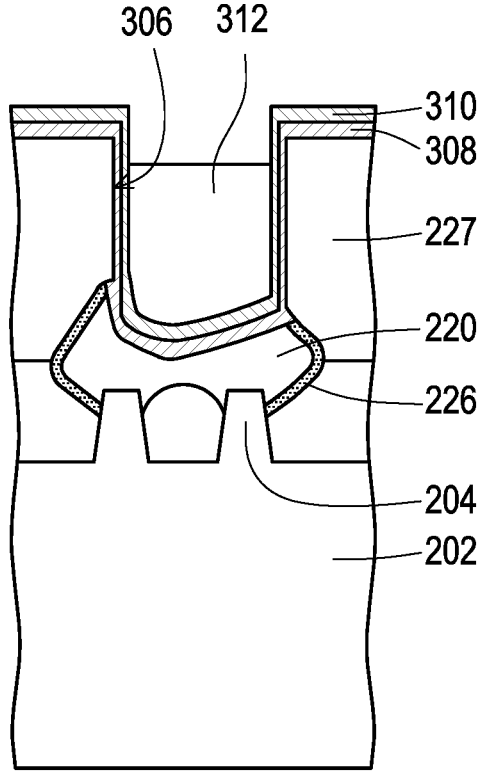

Referring to FIG. 4C and FIG. 5C, the protection layer 312 is partially removed. For example, a portion of the protection layer 312 outside the opening 306 and a portion of the protection layer 312 in the opening 306 are removed. After partial removal, a top surface of the protection layer 312 may be lower than the top surface of the dielectric layer 227. For example, portions of the first material 308 and the second material 310 on the sidewalls of the opening 306 are exposed. In some embodiments, the protection layer 312 is removed by an etching process such as a dry etching process and a wet etching process.

Figure 4D:
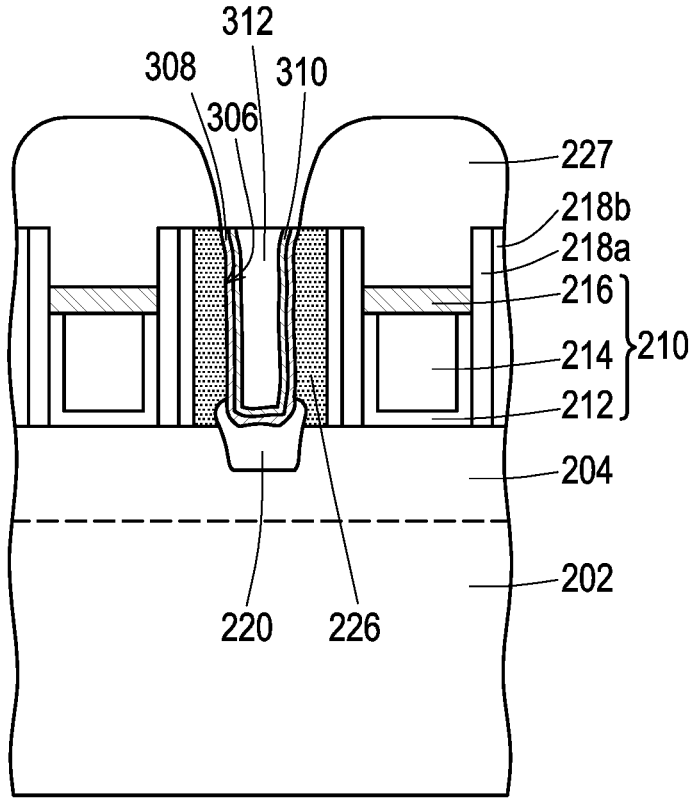
Figure 5D:
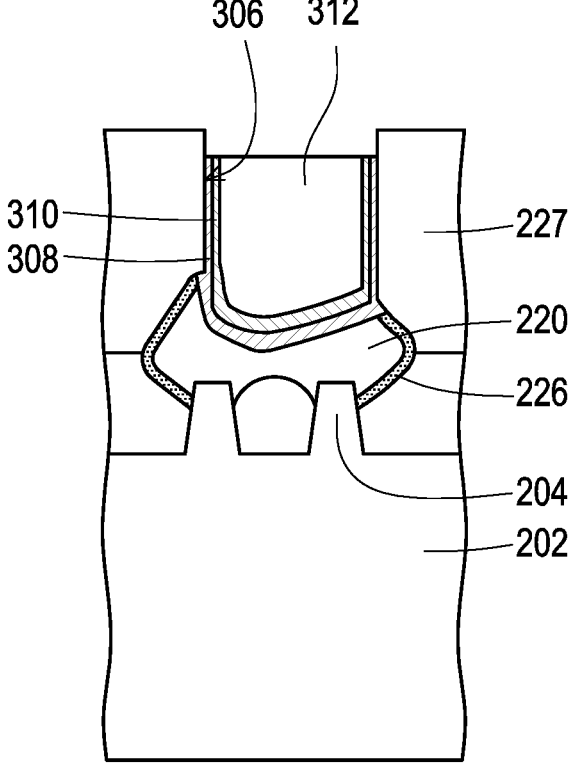

Referring to FIG. 4D and FIG. 5D, a pull-back process is performed on the first material 308 and the second material 310. The "pull-back" process may be equivalently referred to as an "etch-back" process. In some embodiments, top portions of the first material 308 and the second material 310 are removed by the pull-back process. For example, the portions of the first material 308 and the second material 310 are removed, resulting in the first material 308 and the second material 310 have top surfaces substantially flush with the top surface of the protection layer 312. In some embodiments, the pull-back process includes a dry etching process, a wet etching process or combinations thereof.

Figure 4E:
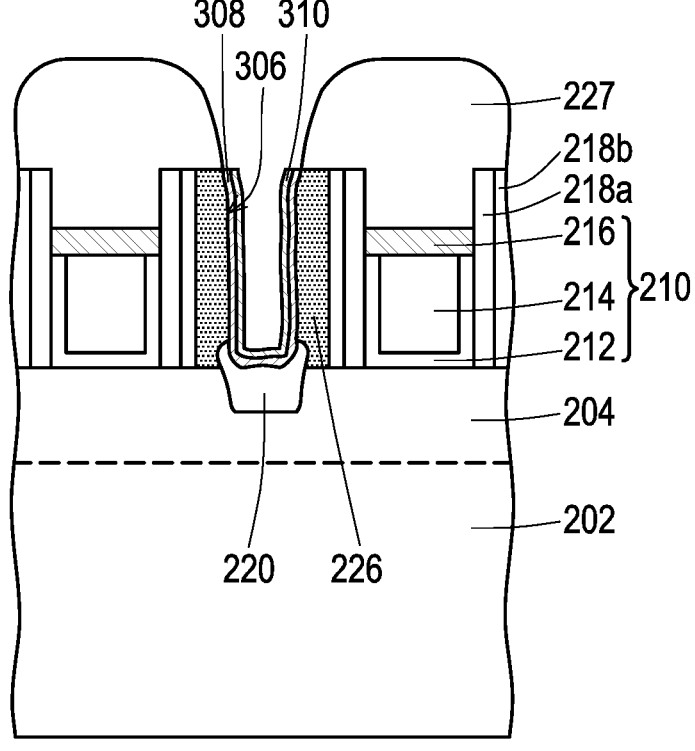
Figure 5E:
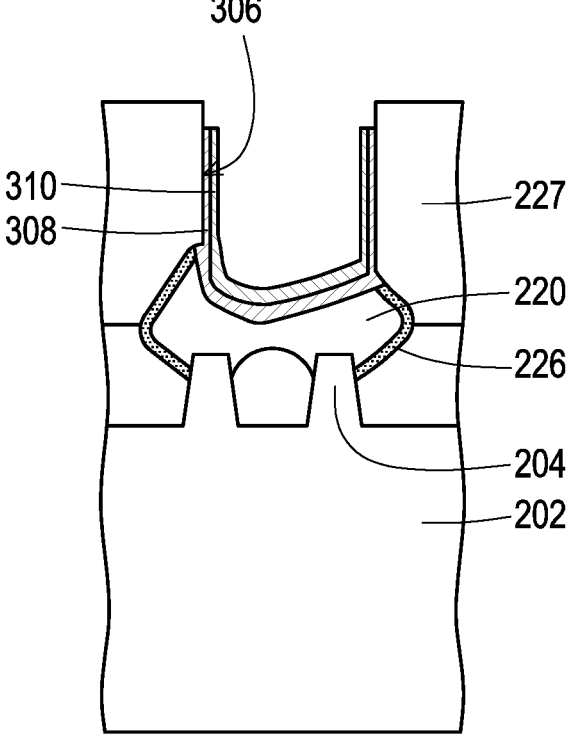

Referring to FIG. 4E and FIG. 5E, the protection layer 312 is removed. In some embodiments, the protection layer 312 is removed by an ashing process, an etching process or combinations thereof.

Figure 4F:
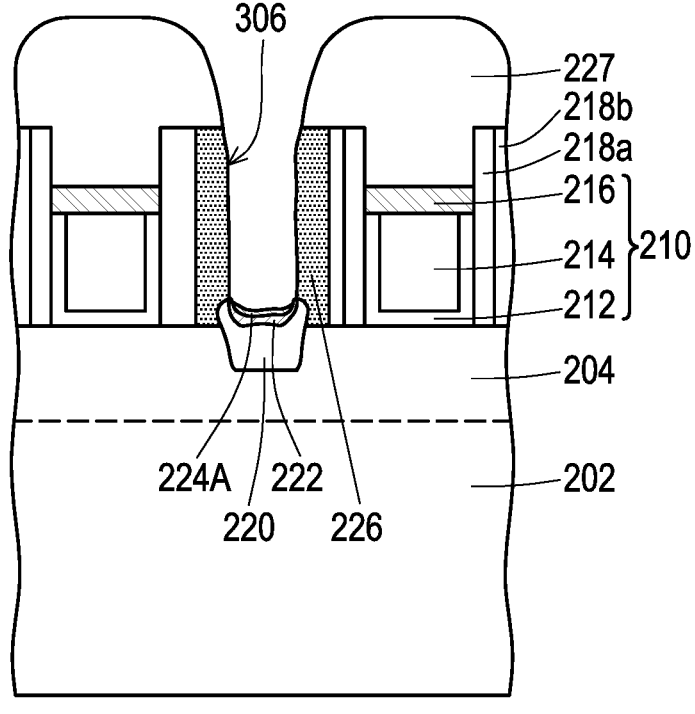
Figure 5F:
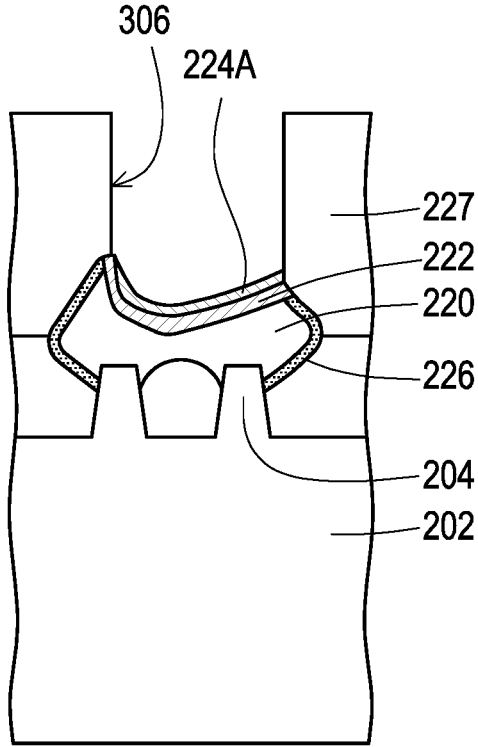

Referring to FIG. 4F and FIG. 5F, a pull-back process is performed on the first material 308 and the second material 310, to form a first material layer 222 and a second material layer 224A. In some embodiments, the first material 308 and the second material 310 on the sidewalls of the opening 306 are removed by the pull-back process. In addition, a top portion of the second material 310 on the bottom of the opening 306 may be removed by the pull-back process. In other words, a thickness of the second material layer 224A of FIG. 4F and FIG. 5F at the bottom of the opening 306 is smaller than a thickness of the second material 310 of FIG. 4E and FIG. 5E. In some embodiments, the pull-back process includes a dry etching process, a wet etching process or combinations thereof. After the pull-back process, top surfaces of the first material layer 222 and the second material layer 224A are substantially coplanar, for example. In some embodiments, the first material layer 222 surrounds the second material layer 224A, and the top surface of the first material layer 222 is exposed. In some embodiments, the first material layer 222 and the second material layer 224A have a concave top surface respectively. However, the disclosure is not limited thereto. In some alternative embodiments, at least one of the first material layer 222 and the second material layer 224A has a flat top surface.

Figure 4G:
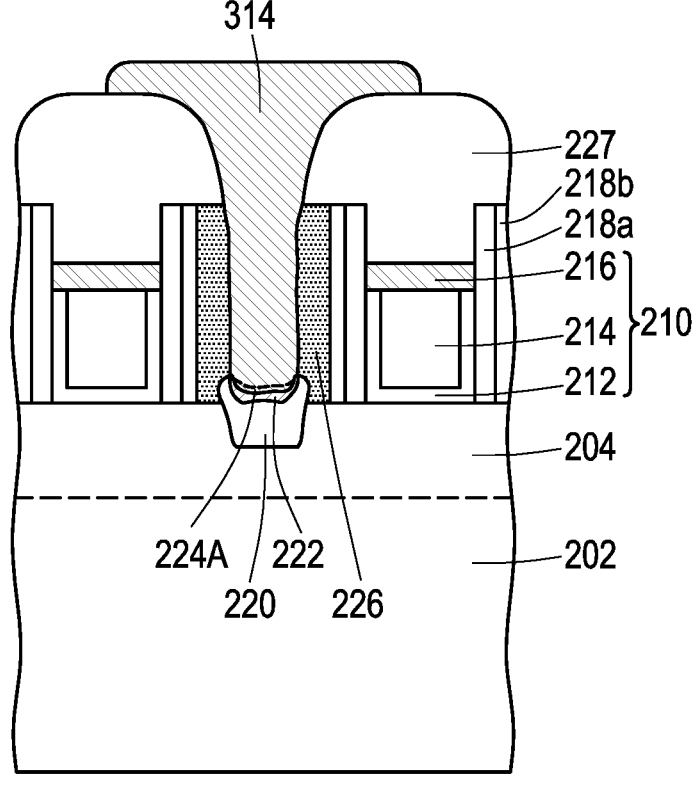
Figure 5G:
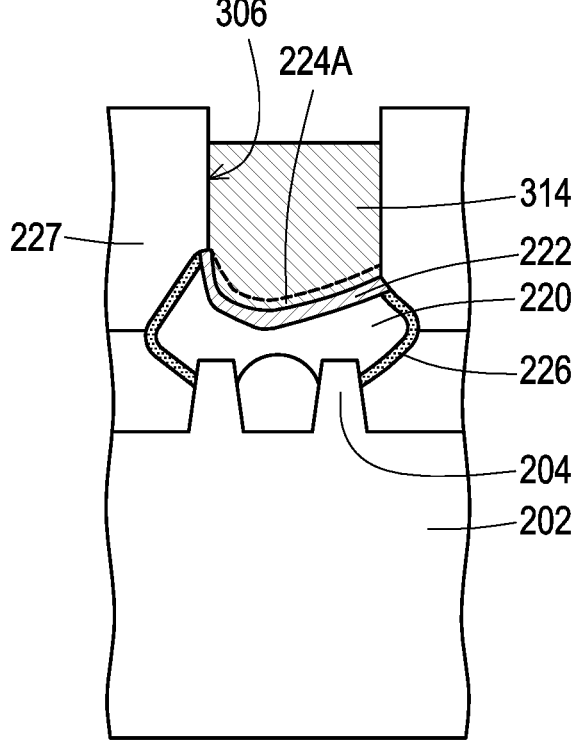

Referring to FIG. 4G and FIG. 5G, a second material 314 is directly formed on the second material layer 224A to fill the opening 306. In some embodiments, the second material layer 224A is also referred to as a grain-boundary free substrate. The second material 314 is in direct contact with the second material layer 224A. In some embodiments, the second material 314 has the same material as the second material layer 224A. For example, the second material layer 224A and the second material 314 both include tungsten. The second material 314 may be formed by a suitable deposition technique such as PVD, CVD, ALD, a combination thereof or the like. For example, the second material 314 is formed by a selective metal deposition process. In some embodiments, as shown in FIG. FIG. 4G and FIG. 5G, the second material 314 is formed to fill the opening 306 and is further extended outside the opening 306. For example, the second material 314 covers the top surface of the dielectric layer 227. In some embodiments, since the second material 314 is directly formed on the second material layer 224A (e.g., a grain-boundary free substrate), grains of the second material 314 are similar to or substantially the same as the grains shown in FIG. 2. In other words, a cross-sectional area of the grain of the second material 314 is larger than 500 nm², and the second material 314 has less grain-boundary or is substantially free of grain-boundary.

Figure 4H:
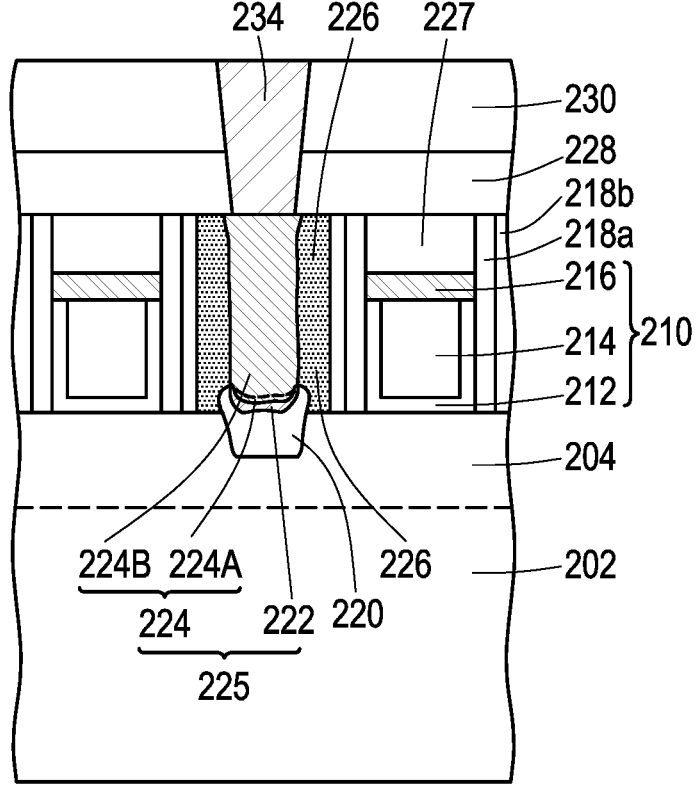
Figure 5H:
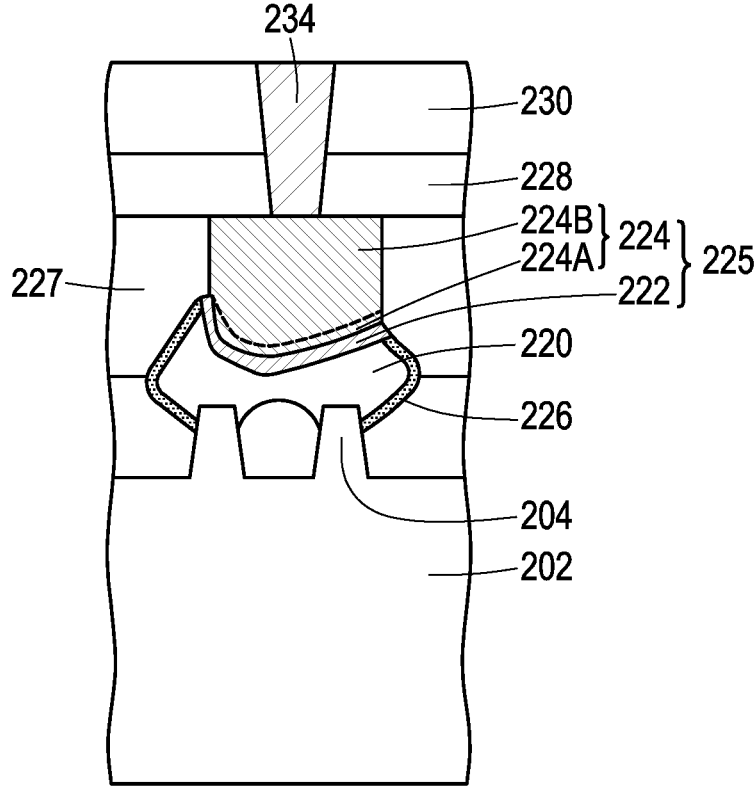

Referring to FIG. 4H and FIG. 5H, a portion of the second material 314 outside the opening 306 is removed, so as to form a second material layer 224B in the opening 306. In some embodiments, the second material 314 outside the opening 306 is entirely removed by a planarization process such as a CMP process. In some embodiments, the second material layer 224A and the second material layer 224B form the second material layer 224, and the second material layer 224 and the first material layer 222 form the conductive structure 225. In some embodiments, an interface is formed between the second material layer 224A and the second material layer 224B. However, the disclosure is not limited thereto. In some alternative embodiments, an interface does not exist between the second material layer 224A and the second material layer 224B.

In some embodiments, since the second material layer 224 has larger grain size and has less grain-boundary or is substantially free of grain-boundary, the resistance of the second material layer 224 is low. In addition, the second material layer 224 may be formed by in-situ deposition process, that is, the chamber for the deposition process of the second material layer 224 may be the same as the chamber for the formation of the material layer 222. Due to the in-situ deposition, there may be interface oxidation free between the second material layer 224 and the material layer 222, and thus the second material layer 224 may provide low contact resistance. Therefore, the conductive structure 225 may provide both low resistance and low contact resistance. In addition, other conductive structures such as the gate structures 210, the gate contacts 232, and the source and drain contacts 234 may be also formed by the process of FIG. 1A to FIG. 1H, to provide low resistance and low contact resistance. Accordingly, the semiconductor device 200 may has an improved performance.

Figure 6:
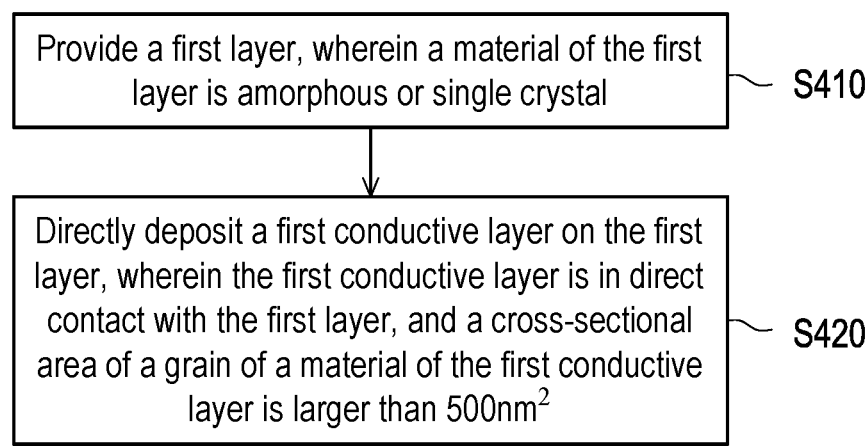
FIG. 6 illustrates a method of forming a semiconductor device in accordance with some embodiments of the present disclosure.

FIG. 6 illustrates a method of forming a semiconductor device in accordance with some embodiments of the present disclosure. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act S410, a first layer is provided, wherein a material of the first layer is amorphous or single crystal. FIG. 1A, FIG. 4A and FIG. 5A illustrate views corresponding to some embodiments of act S410.

At act S420, a first conductive layer is directly deposited on the first layer, wherein the first conductive layer is in direct contact with the first layer, and a cross-sectional area of a grain of a material of the first conductive layer is larger than 500 nm². FIG. 1A, FIG. 1G, FIG. 2, FIG. 4A, FIG. 4G, FIG. 5A and FIG. 5G illustrate views corresponding to some embodiments of act S420.

Figure 7:
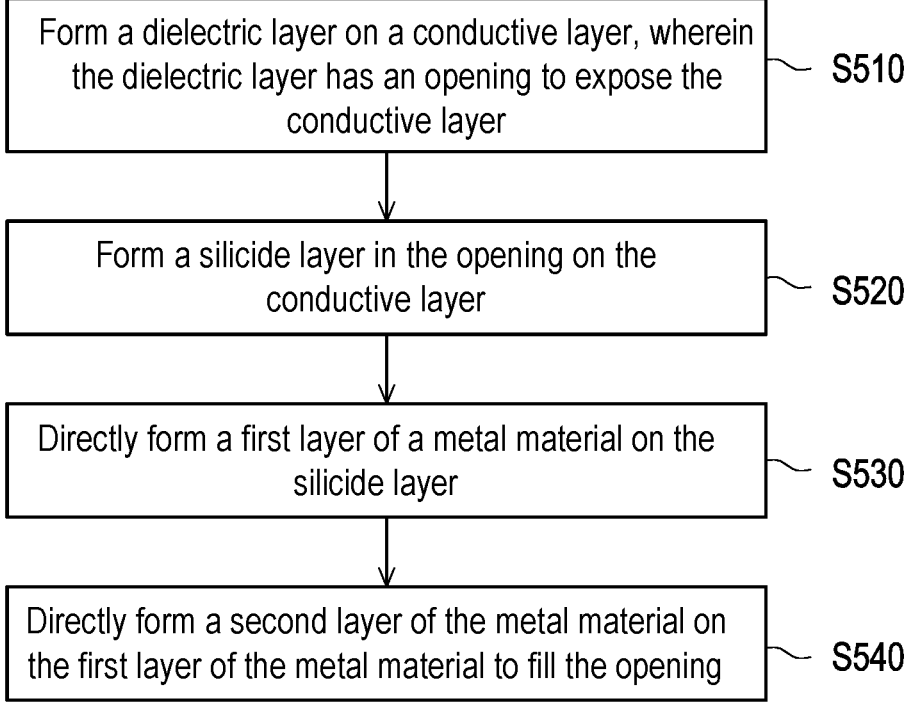
FIG. 7 illustrates a method of forming a semiconductor device in accordance with some embodiments of the present disclosure.

FIG. 7 illustrates a method of forming a semiconductor device in accordance with some embodiments of the present disclosure. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act S510, a dielectric layer is formed on a conductive layer, wherein the dielectric layer has an opening to expose the conductive layer. FIG. 1A, FIG. 4A and FIG. 5A illustrate views corresponding to some embodiments of act S510.

At act S520, a silicide layer is formed in the opening on the conductive layer. FIG. 1A, FIG. 4A and FIG. 5A illustrate views corresponding to some embodiments of act S520.

At act S530, a first layer of a metal material is directly formed on the silicide layer. FIG. 1A, FIG. 4A and FIG. 5A illustrate views corresponding to some embodiments of act S530.

At act S540, a second layer of the metal material is directly formed on the first layer of the metal material to fill the opening. FIG. 1G, FIG. 4G and FIG. 5G illustrate views corresponding to some embodiments of act S540.

In accordance with some embodiments of the disclosure, a method of forming a semiconductor device includes the following steps. A first layer is provided, wherein a material of the first layer is amorphous or single crystal. A first conductive layer is directly deposited on the first layer, wherein the first conductive layer is in direct contact with the first layer, and a cross-sectional area of a grain of a material of the first conductive layer is larger than 500 $nm^2$.

In accordance with some embodiments of the disclosure, a method of forming a semiconductor device includes the following steps. A dielectric layer is formed on a conductive layer, wherein the dielectric layer has an opening to expose the conductive layer. A silicide layer is formed in the opening on the conductive layer. A first layer of a metal material is directly formed on the silicide layer. A second layer of the metal material is directly formed on the first layer of the metal material to fill the opening.

In accordance with some embodiments of the disclosure, a semiconductor device includes a first layer and a first metal layer. A material of the first layer is amorphous or single crystal. The first metal layer is in direct contact with the first layer, and a cross-sectional area of a grain of a material of the first metal layer is larger than 500 $nm^2$.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
   providing a first layer, wherein a material of the first layer is amorphous or single crystal;
   directly depositing a first conductive layer on the first layer, wherein the first conductive layer is in direct contact with the first layer, and a cross-sectional area of a grain of a material of the first conductive layer is larger than 500 $nm^2$; and
   removing portions of the first layer and the first conductive layer, wherein the first layer surrounds sidewalls of the first conductive layer.

2. The method of claim 1, wherein the material of the first layer includes silicon, metal or silicide.

3. The method of claim 1, wherein the material of the first layer includes silicon oxide or titanium silicon.

4. The method of claim 1, wherein the first layer is formed on a source/drain region.

5. The method of claim 1, further comprising directly depositing a second conductive layer on the first conductive layer, wherein a material of the second conductive layer is the same as the material of the first conductive layer.

6. The method of claim 5, wherein the cross-sectional area of a grain of the material of the second conductive layer is larger than 500 $nm^2$.

7. The method of claim 5, wherein the second conductive layer is formed by a selective deposition process.

8. The method of claim 1, wherein the material of the first conductive layer comprises tungsten.

9. A method of forming a semiconductor device, comprising:
   forming a silicide layer in an opening of a dielectric layer;
   forming a first conductive layer on the silicide layer, wherein the first conductive layer is in direct contact with the silicide layer, and a cross-sectional area of a grain of a material of the first conductive layer is larger than 500 $nm^2$;
   removing portions of the silicide layer and the first conductive layer, wherein the first layer surrounds sidewalls of the first conductive layer; and
   forming a second conductive layer on the first conductive layer to fill the opening.

10. The method of claim 9, wherein a cross-sectional area of a grain of the second conductive layer is larger than 500 $nm^2$.

11. The method of claim 9, wherein forming the silicide layer and the first conductive layer and removing portions of the silicide layer and the first conductive layer comprises:
   forming the silicide layer on a surface of the opening;
   forming the first conductive layer on the silicide layer over the surface of the opening;
   forming a protection material to fill the opening;
   removing first portions of the first conductive layer, the silicide layer and the protection material;
   removing the remained protection material; and
   removing second portions of the first conductive layer and the silicide layer.

12. The method of claim 11, wherein removing the first portions of the first conductive layer, the silicide layer and the protection material comprises:
   removing the first portion of the protection material, wherein a top surface of the protection material is lower than a top surface of the opening; and
   removing the first portions of the first conductive layer and the silicide layer, so that top surfaces of the first conductive layer and the silicide layer are substantially flush with the top surface of the protection material.

13. The method of claim 11, wherein the protection material includes an anti-reflective coating material.

14. The method of claim 12, wherein removing the first portions of the first conductive layer and the silicide layer is performed by a pull-back process.

15. The method of claim 11, wherein removing the second portions of the first conductive layer and the silicide layer is performed by a pull-back process.

16. The method of claim 9, wherein the second conductive layer is formed by a selective deposition process.

17. A method of forming a semiconductor device, comprising:
   forming a silicide layer on a source/drain region;
   forming a first conductive layer on the silicide layer, wherein a cross-sectional area of a grain of a material of the first conductive layer is larger than 500 $nm^2$;
   removing portions of the silicide layer and the first conductive layer, wherein the first layer surrounds sidewalls of the first conductive layer; and
   forming a first contact on the first conductive layer.

18. The method of claim 17, wherein forming the silicide layer and the first conductive layer comprises:

forming an opening surrounding by a pair of spacers to expose the source/drain region;

conformally forming the silicide layer on an exposed surface the opening;

conformally forming the first conductive layer on the silicide layer over the exposed surface the opening; and removing the portions of the silicide layer and the first conductive layer, such that top surfaces of the silicide layer and the first conductive layer are lower than a top surface of the pair of spacers.

19. The method of claim 18, further comprising forming a second contact on the first contact, wherein an interface between the first contact and the second contact is substantially coplanar with the top surface of the pair of spacers.

20. The method of claim 17, wherein a material of the contact is the same as the material of the first conductive layer.

\* \* \* \* \*